United States Patent
Tsurusaki et al.

(10) Patent No.: US 11,476,130 B2
(45) Date of Patent: Oct. 18, 2022

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Kotaro Tsurusaki, Kumamoto (JP); Koji Yamashita, Kumamoto (JP); Kazuya Koyama, Kumamoto (JP); Kouzou Kanagawa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 305 days.

(21) Appl. No.: 16/805,898

(22) Filed: Mar. 2, 2020

(65) Prior Publication Data

US 2020/0286754 A1 Sep. 10, 2020

(30) Foreign Application Priority Data

Mar. 7, 2019 (JP) .............................. JP2019-042024

(51) Int. Cl.
| | |
|---|---|
| *H01L 21/67* | (2006.01) |
| *H01L 21/687* | (2006.01) |
| *B05B 1/00* | (2006.01) |
| *B05B 13/02* | (2006.01) |

(52) U.S. Cl.
CPC .......... *H01L 21/67051* (2013.01); *B05B 1/00* (2013.01); *B05B 13/02* (2013.01); *H01L 21/67034* (2013.01); *H01L 21/67253* (2013.01); *H01L 21/687* (2013.01)

(58) Field of Classification Search
CPC ......... H01L 21/67051; H01L 21/67034; H01L 21/67253; H01L 21/687; H01L 21/67028; H01L 21/67057; H01L 21/67109; H01L 21/67313; H01L 21/67757; H01L 21/67103; H01L 21/0201; H01L 21/67712; B05B 1/00; B05B 13/02; B05B 12/087; B08B 3/048

See application file for complete search history.

(56) References Cited

U.S. PATENT DOCUMENTS

| | | | | |
|---|---|---|---|---|
| 5,940,985 | A | * 8/1999 | Kamikawa | ........ H01L 21/02052 257/E21.228 |
| 6,029,371 | A | * 2/2000 | Kamikawa | ........ H01L 21/67034 34/92 |
| 6,139,645 | A | * 10/2000 | Leenaars | ........... H01L 21/67023 134/32 |

(Continued)

FOREIGN PATENT DOCUMENTS

| | | |
|---|---|---|
| JP | 2000-091301 A | 3/2000 |
| WO | WO-2005098918 A1 * 10/2005 | ....... H01L 21/67028 |

*Primary Examiner* — Alexander Markoff
(74) *Attorney, Agent, or Firm* — Venjuris, P.C.

(57) ABSTRACT

A substrate processing apparatus includes a liquid processing tank, a movement mechanism, an ejector, and a controller. The liquid processing tank stores a processing liquid. The movement mechanism moves a plurality of substrates immersed in the liquid processing tank to a position above the liquid surface of the processing liquid. The ejector ejects a vapor of an organic solvent toward portions of the plurality of substrates that are exposed from the liquid surface. The controller changes an ejection flow rate of the vapor ejected by the ejector as the plurality of substrates are moved up.

16 Claims, 11 Drawing Sheets

(56) References Cited

U.S. PATENT DOCUMENTS

| | | | |
|---|---|---|---|
| 6,681,781 B2* | 1/2004 | Puri | B08B 3/12 |
| | | | 257/E21.228 |
| 2003/0192570 A1* | 10/2003 | Thakur | B08B 3/12 |
| | | | 134/144 |
| 2004/0194806 A1* | 10/2004 | Yang | H01L 21/67034 |
| | | | 134/34 |
| 2006/0143937 A1* | 7/2006 | Eichler | H01L 21/67034 |
| | | | 34/471 |
| 2007/0272278 A1* | 11/2007 | Fishkin | H01L 21/67028 |
| | | | 134/30 |
| 2009/0101186 A1* | 4/2009 | Hiroshiro | H01L 21/67028 |
| | | | 134/56 R |

* cited by examiner

SUBSTRATE PROCESSING APPARATUS, SUBSTRATE PROCESSING METHOD, AND STORAGE MEDIUM

CROSS-REFERENCE TO RELATED APPLICATIONS

This application is based on and claims priority from Japanese Patent Application No. 2019-042024, filed on Mar. 7, 2019, with the Japan Patent Office, the disclosure of which is incorporated herein in its entirety by reference.

TECHNICAL FIELD

The present disclosure relates to a substrate processing apparatus, a substrate processing method, and a storage medium.

BACKGROUND

In the related art, there is known a substrate processing apparatus which replaces a processing liquid attached to a substrate with an organic solvent by bringing the substrate into contact with a vapor of the organic solvent after a liquid processing, and then, dries the substrate by volatilizing the organic solvent attached to the substrate.

Japanese Patent Laid-Open Publication No. 2000-091301 discloses a substrate processing apparatus including a liquid processing tank that stores a processing liquid, a drying chamber disposed above the liquid processing tank and provided with a supply that supplies a vapor of an organic solvent, and a movement mechanism that moves a plurality of substrates between the liquid processing tank and the drying chamber.

SUMMARY

According to an aspect of the present disclosure, a substrate processing apparatus includes a liquid processing tank, a movement mechanism, an ejector, and a controller. The liquid processing tank stores a processing liquid. The movement mechanism moves a plurality of substrates immersed in the liquid processing tank to a position above a liquid surface of the processing liquid. The ejector ejects a vapor of an organic solvent toward portions of the plurality of substrates that are exposed from the liquid surface. The controller changes an ejection flow rate of the vapor ejected by the ejector as the plurality of substrates are moved to the position above the liquid surface of the processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
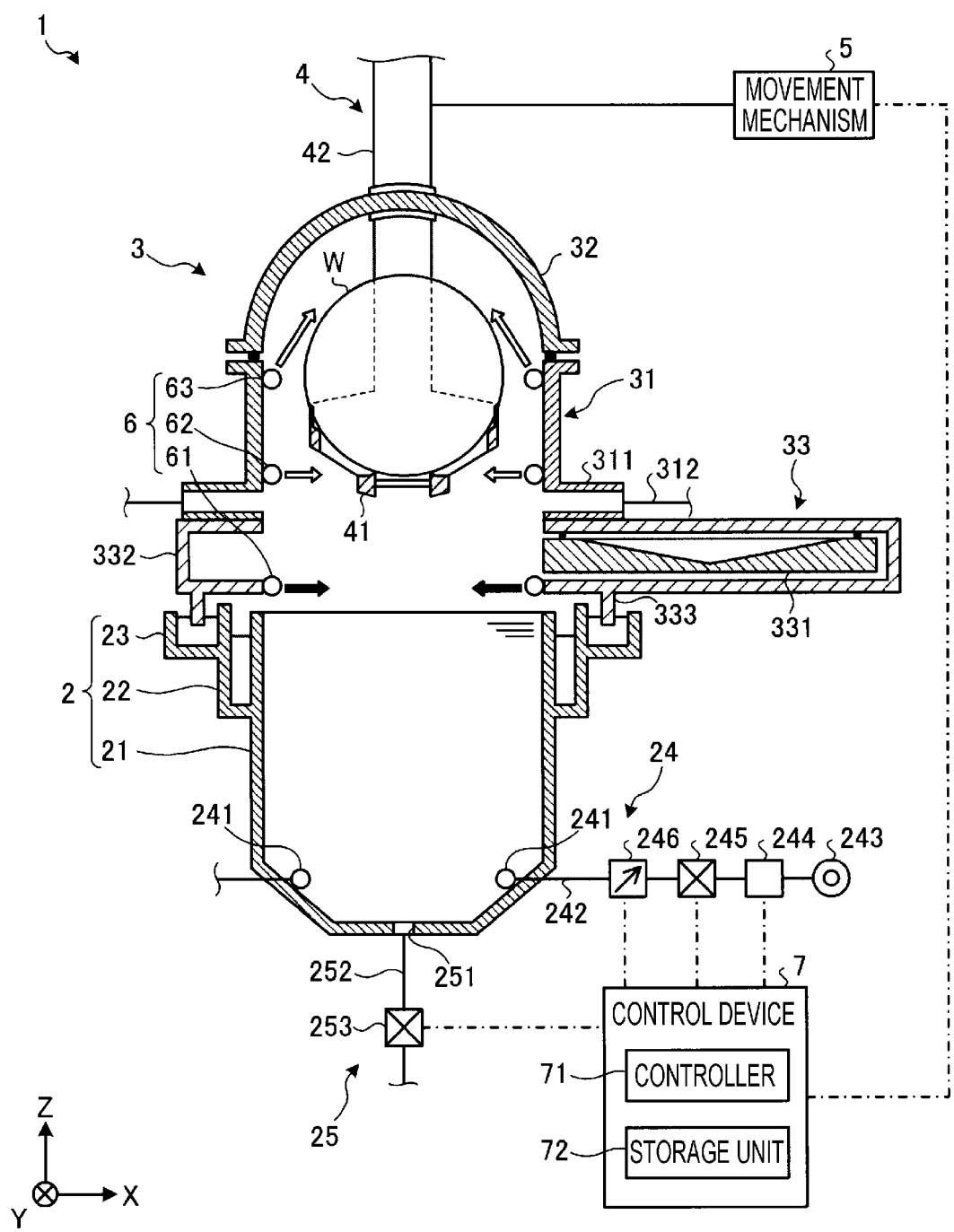
FIG. 1 is a cross-sectional view of a substrate processing apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for implementing a substrate processing apparatus, a substrate processing method, and a storage medium according to the present disclosure (hereinafter, referred to as "embodiments") will be described in detail with reference to the accompanying drawings. Meanwhile, the substrate processing apparatus, the substrate processing method, and the storage medium according to the present disclosure are not limited to the embodiments. Further, the embodiments may be appropriately combined with each other in a scope that does not cause any inconsistency in process contents. Further, in the respective embodiments, similar portions will be denoted by the same reference numerals, and overlapping descriptions thereof will be omitted.

In addition, in each of the drawings to be referred to herein below, an X-axis direction, a Y-axis direction, and a Z-axis direction which are orthogonal to each other are defined, and an orthogonal coordinate system in which the Z-axis positive direction is a vertically upward direction may be illustrated in order to facilitate the understanding of descriptions.

<Configuration of Substrate Processing Apparatus>

Figure 2:
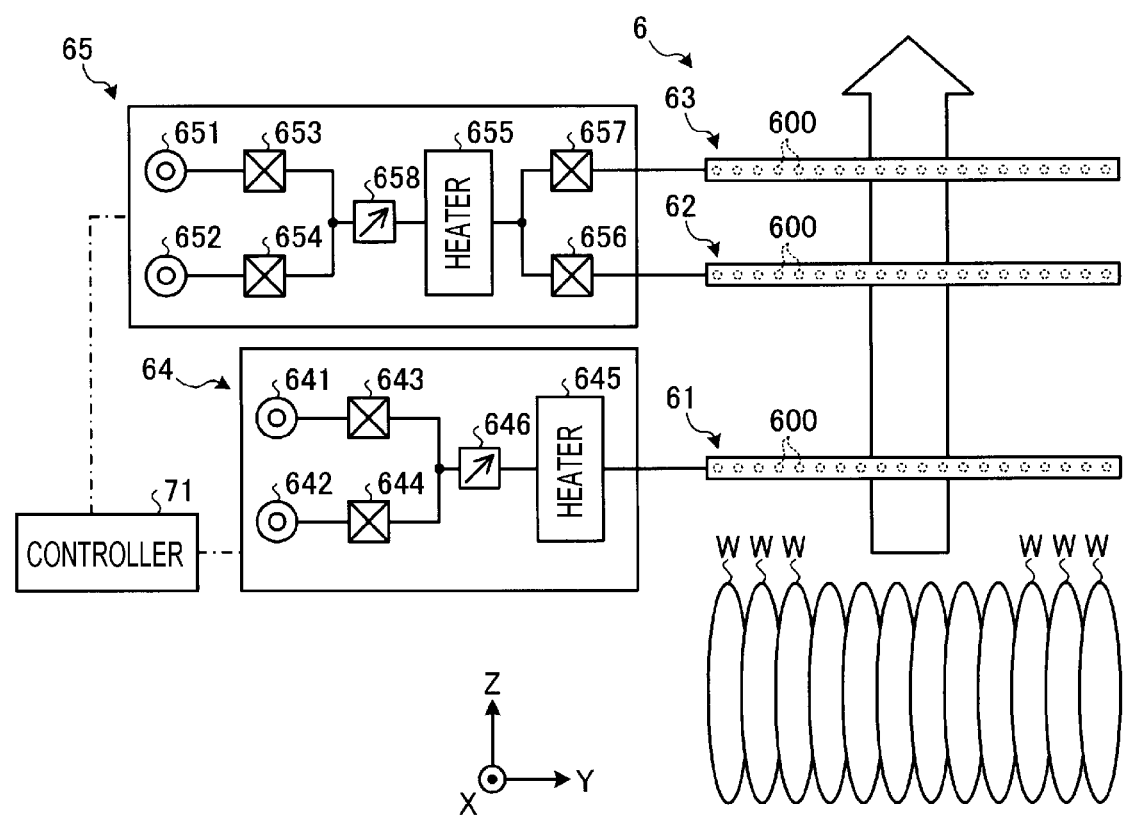
FIG. 2 is a view illustrating a configuration of an ejector according to the embodiment.

First, a configuration of a substrate processing apparatus according to an embodiment will be described with reference to FIGS. 1 and 2. FIG. 1 is a schematic cross-sectional view of a substrate processing apparatus according to an embodiment. In addition, FIG. 2 is a view illustrating a configuration of an ejector according to the embodiment.

As illustrated in FIG. 1, a substrate processing apparatus 1 according to the embodiment includes a liquid processing tank 2, a drying chamber 3, a holder 4, a movement mechanism 5, a gas ejector 6, and a control device 7.

(Liquid Processing Tank 2)

The liquid processing tank 2 includes a storage tank 21, an overflow tank 22, and a seal tank 23. The liquid processing tank 2 is able to accommodate a plurality of semiconductor substrates (hereinafter, referred to as "wafers W") arranged in a vertical posture (vertical state). In the liquid processing tank 2, a liquid processing is performed to process the plurality of wafers W by immersing the plurality of wafers W in a processing liquid stored in the liquid processing tank 2. Here, it is assumed that deionized water is used as the processing liquid. Further, it is assumed that a cleaning processing for cleaning the plurality of wafers W with the deionized water is performed as the liquid processing.

The storage tank 21 is provided with a liquid ejector 24 that supplies the processing liquid and a draining mechanism 25 that drains the processing liquid.

The liquid ejector 24 includes a plurality of nozzles 241 (two nozzles in this example), a supply path 242, a processing liquid supply source 243, a cooler 244, a valve 245, and a flow rate regulator 246. The two nozzles 241 are provided on the inner bottom of the storage tank 21. The supply path 242 connects the two nozzles 241 and the processing liquid supply source 243 to each other. The processing liquid supply source 243 supplies the processing liquid to the two nozzles 241.

The cooler 244 is, for example, a chiller, and cools the processing liquid supplied from the processing liquid supply source 243. For example, the temperature of the processing liquid supplied from the processing liquid supply source 243 is a room temperature, and the cooler 244 cools the processing liquid supplied from the processing liquid supply source 243 to a temperature equal to or lower than the room temperature (e.g., 20° C. or lower).

The valve 245 opens/closes the supply path 242. The flow rate regulator 246 regulates the flow rate of the processing liquid that flows through the supply path 242. The cooler 244, the valve 245, and the flow rate regulator 246 are electrically connected to a controller 71 of the control device 7, and are controlled by the controller 71.

The draining mechanism 25 includes a drain port 251, a drain path 252, and a valve 253. The drain port 251 is provided at the center of the inner bottom of the storage tank 21. The drain path 252 is connected to the drain port 251. The valve 253 is provided in the middle of the drain path 252, and opens and closes the drain path 252. The valve 253 is electrically connected to the controller 71, such that the opening/closing of the valve 253 are controlled by the controller 71.

The overflow tank 22 is formed at the upper outer peripheral portion of the storage tank 21, and stores the processing liquid that overflows from the storage tank 21. The seal tank 23 is formed at the upper outer peripheral portion of the overflow tank 22, and stores, for example, a liquid such as water. By immersing a seal wall 333 to be described later in the liquid stored in the seal tank 23, the inside and the outside of the liquid processing tank 2 may be blocked from each other.

(Drying Chamber 3)

The drying chamber 3 is disposed above the liquid processing tank 2, and has an internal space that communicates with the storage tank 21. The drying chamber 3 includes a main body 31, a lid 32, and a shield 33. The main body 31 is opened at the top and bottom thereof. The main body 31 is provided with a plurality of exhaust ports 311 (two exhaust ports in this example). The two exhaust ports 311 are provided to be bilaterally symmetric with each other at the lower portions of the lateral surface of the main body 31 that are positioned in the direction (X-axis direction) orthogonal to the arrangement direction of the plurality of wafers W (Y-axis direction). The two exhaust ports 311 are connected to exhaust paths 312, and the atmosphere in the drying chamber 3 is discharged to the outside via the exhaust ports 311 and the exhaust paths 312.

The lid 32 is disposed above the main body 31, and closes the top opening of the main body 31. The lid 32 is configured to be movable up and down by a movement mechanism (not illustrated), and when the lid 32 is moved up, the plurality of wafers W may be carried in or out from the drying chamber 3.

The shield 33 is disposed below the main body 31. The shield 33 includes a shielding door 331 and a housing 332. The shielding door 331 is configured to be movable horizontally (X-axis direction in this example) inside the housing 332 by a movement mechanism (not illustrated), and closes or opens the bottom opening of the main body 31.

The housing 332 is interposed between the liquid processing tank 2 and the main body 31, and accommodates the shielding door 331 therein. An opening is formed in the top of the housing 332 to communicate with the bottom opening of the main body 31, and an opening is formed in the bottom of the housing 332 to communicate with the region above the storage tank 21.

The seal wall 333 is provided at the bottom of the housing 332 to project downward. The seal wall 333 is immersed in the liquid stored in the seal tank 23. As a result, the inside and the outside of the liquid processing tank 2 may be blocked from each other.

(Holder 4)

The holder 4 includes a holding body 41 and a shaft 42 that supports the holding body 41. The holding body 41 holds the plurality of wafers W in the vertical posture. Further, the holding body 41 holds the plurality of wafers W in a state of being arranged horizontally (Y-axis direction in this example) at a constant interval. The shaft 42 extends along the vertical direction, and supports the holding body 41 at the lower portion thereof. The shaft 42 is slidably inserted through an opening (not illustrated) provided in the upper portion of the lid 32.

(Movement Mechanism 5)

The movement mechanism 5 includes, for example, a motor, a ball screw, a cylinder and others, and is connected to the shaft 42 of the holder 4 to move the shaft 42 up and down. When the shaft 42 is moved up and down by the movement mechanism 5, the holding body 41 supported by the shaft 42 is moved up and down. Accordingly, the movement mechanism 5 is able to move the plurality of wafers W held by the holding body 41 between the storage tank 21 and the drying chamber 3. The movement mechanism 5 is electrically connected to the controller 71 of the control device 7, and controlled by the controller 71.

(Gas Ejector 6)

The gas ejector 6 includes a plurality of nozzles 61 to 63 arranged in multiple tiers in the drying chamber 3. The plurality of nozzles 61 to 63 are arranged on the lateral side of the path in which the plurality of wafers W are moved by the movement mechanism 5, and eject a vapor of an organic solvent toward the plurality of wafers W moved up by the movement mechanism 5. Here, it is assumed that isopropyl alcohol (IPA) is used as the organic solvent. That is, the gas ejector 6 ejects the vapor of IPA (hereinafter, referred to as "IPA vapor") toward the plurality of wafers W. In addition, the organic solvent is not limited to IPA.

As illustrated in FIG. 2, each of the nozzles 61 to 63 has a long shape that extends along the arrangement direction of the plurality of wafers W (Y-axis direction). A plurality of ejection holes 600 are formed in each of the nozzles 61 to 63 along the longitudinal direction of the nozzles 61 to 63. Instead of simple openings, a spray nozzle tip for spraying the IPA vapor in a mist form may be used as the ejection holes 600. Further, each of the nozzles 61 to 63 may have a slit-shaped ejection hole that extends in the longitudinal direction of the nozzles 61 to 63, instead of the plurality of ejection holes 600.

Among the nozzles 61 to 63, the lower nozzle 61 disposed at the lowermost tier is connected to a first supply system 64. The first supply system 64 includes an IPA supply source 641, an $N_2$ supply source 642, valves 643 and 644, a heater 645, and a flow rate regulator 646. The IPA supply source 641 supplies IPA in a liquid state, and the $N_2$ supply source 642 supplies $N_2$ gas which is an inert gas.

The IPA supply source 641 is connected to the heater 645 via the valve 643, and the $N_2$ supply source 642 is connected to the heater 645 via the valve 644. The valves 643 and 644 are electrically connected to the controller 71, such that the opening/closing of the valves 643 and 644 are controlled by the controller 71.

When both the valves 643 and 644 are opened, a mixed fluid of the IPA supplied from the IPA supply source 641 and the $N_2$ gas supplied from the $N_2$ supply source 642 is supplied to the heater 645. The heater 645 heats the mixed fluid to generate the IPA vapor. Further, a two-fluid nozzle (not illustrated) is provided at the subsequent stage of the valve 643, and the mixed fluid of the IPA in the mist form and the $N_2$ gas is supplied to the heater 645.

Meanwhile, when only the valve 644 is opened, the $N_2$ gas is supplied from the $N_2$ supply source 642 to the heater 645. In this case, the heater 645 heats the $N_2$ gas to generate hot $N_2$ gas. The heater 645 is connected to the lower nozzle 61, and supplies the IPA vapor or the hot $N_2$ gas.

The flow rate regulator 646 regulates the flow rate of the gas supplied to the heater 645. The flow rate regulator 646 is configured to include, for example, a flow meter, a constant flow valve, an electric pneumatic regulator and others, and is able to regulate the flow rate of the gas supplied to the heater 645 by regulating the pressure of, for example, the gas ($N_2$ gas) supplied to the electric pneumatic regulator. The flow rate regulator 646 is electrically connected to the controller 71, and controlled by the controller 71.

Among the nozzles 61 to 63, the upper nozzle 63 disposed at the uppermost tier and the middle nozzle 62 disposed between the lower nozzle 61 and the upper nozzle 63 are connected to a second supply system 65.

The second supply system 65 includes an IPA supply source 651, an $N_2$ supply source 652, valves 653, 654, 656, and 657, a heater 655, and a flow rate regulator 658. The IPA supply source 651 supplies IPA in a liquid state, and the $N_2$ supply source 652 supplies $N_2$ gas which is an inert gas.

The IPA supply source 651 is connected to the heater 655 via the valve 653, and the $N_2$ supply source 652 is connected to the heater 655 via the valve 654. The valves 653 and 654 are electrically connected to the controller 71, such that the opening/closing of the valves 653 and 654 are controlled by the controller 71.

When both the valves 653 and 654 are opened, the heater 655 heats the mixed fluid of the IPA supplied from the IPA supply source 651 and the $N_2$ gas supplied from the $N_2$ supply source 652, to generate the IPA vapor. In addition, when only the valve 654 is opened, the heater 655 heats the $N_2$ gas supplied from the $N_2$ supply source 652 to generates hot $N_2$ gas.

The heater 655 is connected to the middle nozzle 62 via the valve 656, and connected to the upper nozzle 63 via the valve 657. The valves 656 and 657 are electrically connected to the controller 71, such that the opening/closing of the valves 656 and 657 are controlled by the controller 71.

The flow rate regulator 658 regulates the flow rate of the gas supplied to the heater 655. The flow rate regulator 658 is configured to include, for example, a flow meter, a constant flow valve, an electric pneumatic regulator and others, and is able to regulate the flow rate of the gas supplied to the heater 655 by regulating the pressure of, for example, the gas ($N_2$ gas) supplied to the electric pneumatic regulator. The flow rate regulator 658 is electrically connected to the controller 71, and controlled by the controller 71.

Here, descriptions have been made on an example where the second supply system 65 is provided to supply the IPA vapor or the hot $N_2$ gas to the middle nozzle 62 and the upper nozzle 63. Without being limited thereto, the gas ejector 6 may include a supply that supplies the IPA vapor or the hot $N_2$ gas to the middle nozzle 62, and a supply that supplies the IPA vapor or the hot $N_2$ gas to the upper nozzle 63.

As illustrated in FIG. 1, the gas ejector 6 includes, for example, two nozzles 61, two nozzles 62, and two nozzles 63. The two lower nozzles 61 are provided to be bilaterally symmetric with each other on the lateral surfaces of the drying chamber 3 that are located in the direction (X-axis direction) orthogonal to the arrangement direction of the plurality of wafers W. The same applies to the two middle nozzles 62 and the two upper nozzles 63.

Among the nozzles 61 to 63, the lower nozzle 61 is disposed near the liquid surface of the processing liquid stored in the storage tank 21. Specifically, the lower nozzle 61 is disposed at a position lower than the height position of the upper ends of the plurality of wafers W when the upper halves of the plurality of wafers W are completely exposed from the liquid surface of the processing liquid. For example, while the middle nozzle 62 and the upper nozzle 63 are provided in the main body 31 of the drying chamber 3, the lower nozzle 61 is provided in the shield 33 of the drying chamber 3 which is relatively close to the storage tank 21. Specifically, the lower nozzle 61 is provided at, for example, the edge of the opening formed in the bottom of the housing 332 of the shield 33 to communicate with the region above the storage tank 21.

The two lower nozzles 61 and the two middle nozzles 62 horizontally eject the IPA vapor or the hot $N_2$ gas toward the plurality of wafers W. Further, the two upper nozzles 63 eject the IPA vapor or the hot $N_2$ gas obliquely upward toward the plurality of wafers W.

(Control Device 7)

The control device 7 is, for example, a computer, and includes the controller 71 and a storage unit 72. For example, the storage unit 72 is implemented by a semiconductor memory device such as a RAM or a flash memory, or a storage device such as a hard disk or an optical disk, and stores programs for controlling various processes performed in the substrate processing apparatus 1. The controller 71 includes a microcomputer provided with a CPU (central processing unit), a ROM (read only memory), a RAM (random access memory), an input/output port and others, or various circuits, and controls the operation of the substrate processing apparatus 1 by reading and executing the programs stored in the storage unit 72.

In addition, the programs may be recorded on a computer-readable storage medium, and may be installed from the storage medium into the storage unit 72 of the control device 7. The computer-readable recording medium may be, for example, a hard disk (HD), a flexible disk (FD), a compact disk (CD), a magnet optical disk (MO), or a memory card.

<Specific Operation of Substrate Processing Apparatus>

Figure 3:
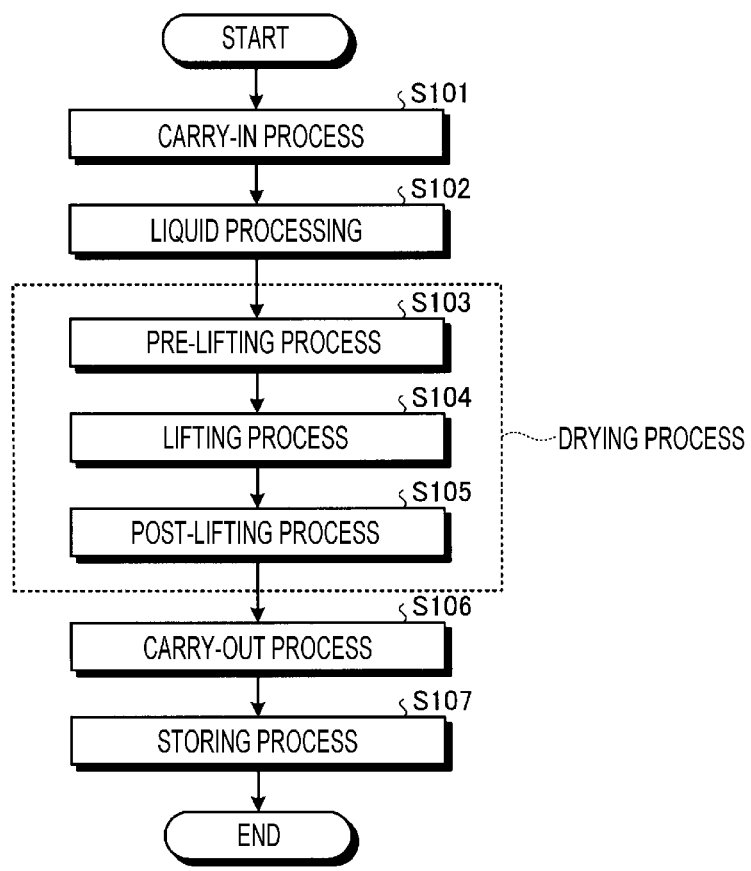
FIG. 3 is a flowchart illustrating an example of a procedure of processes performed by the substrate processing apparatus according to the embodiment.
Figure 4:
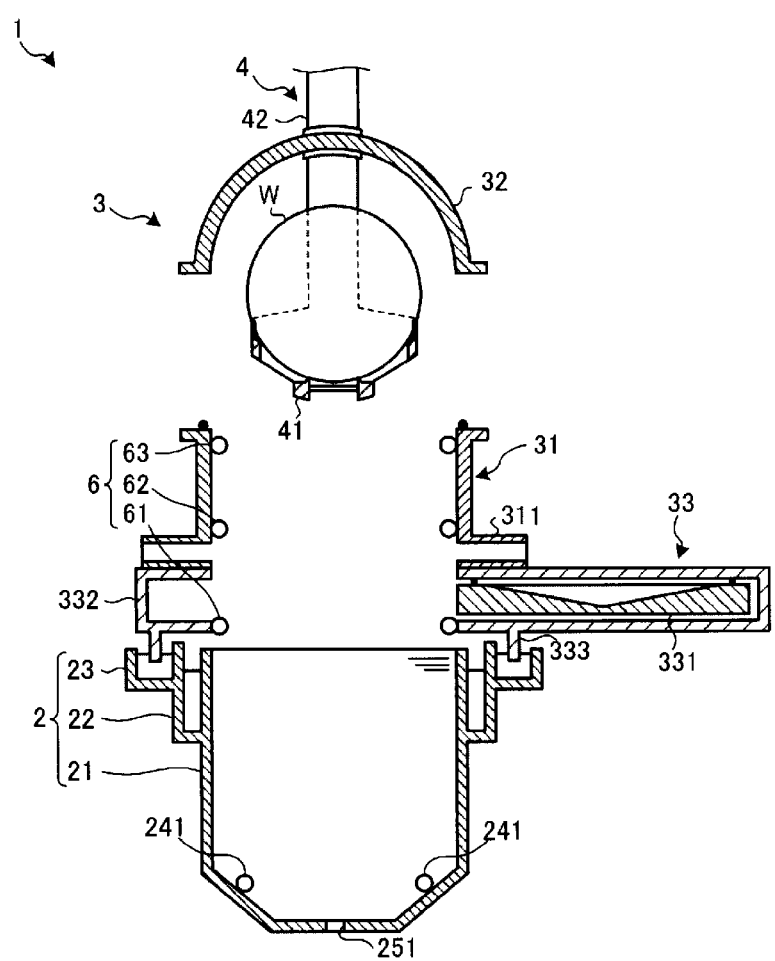
FIG. 4 is a view illustrating an example of an operation of a carry-in process.
Figure 5:
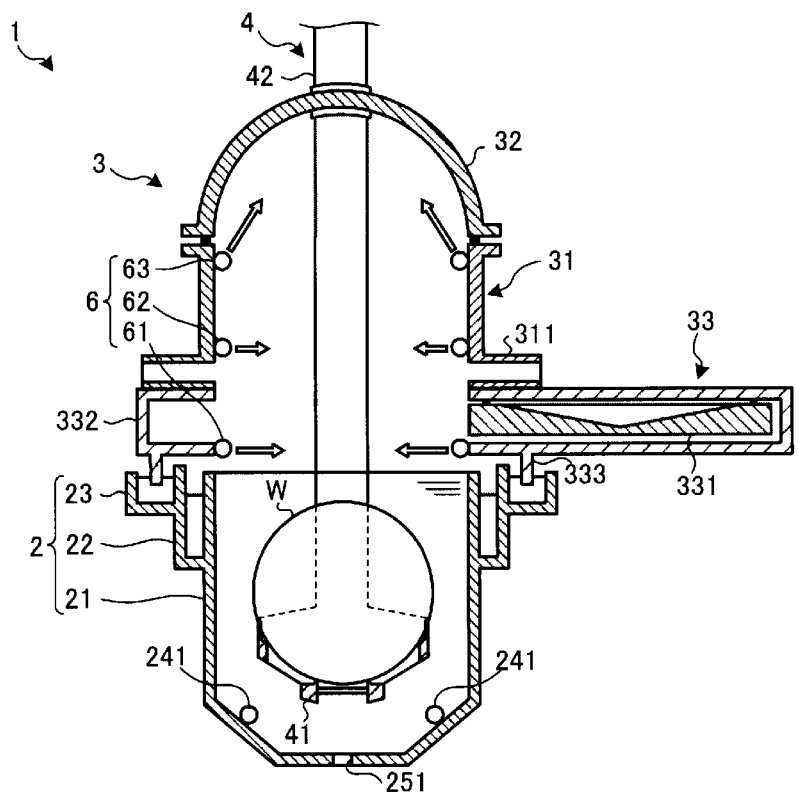
FIG. 5 is a view illustrating an example of an operation of a liquid processing.
Figure 6:
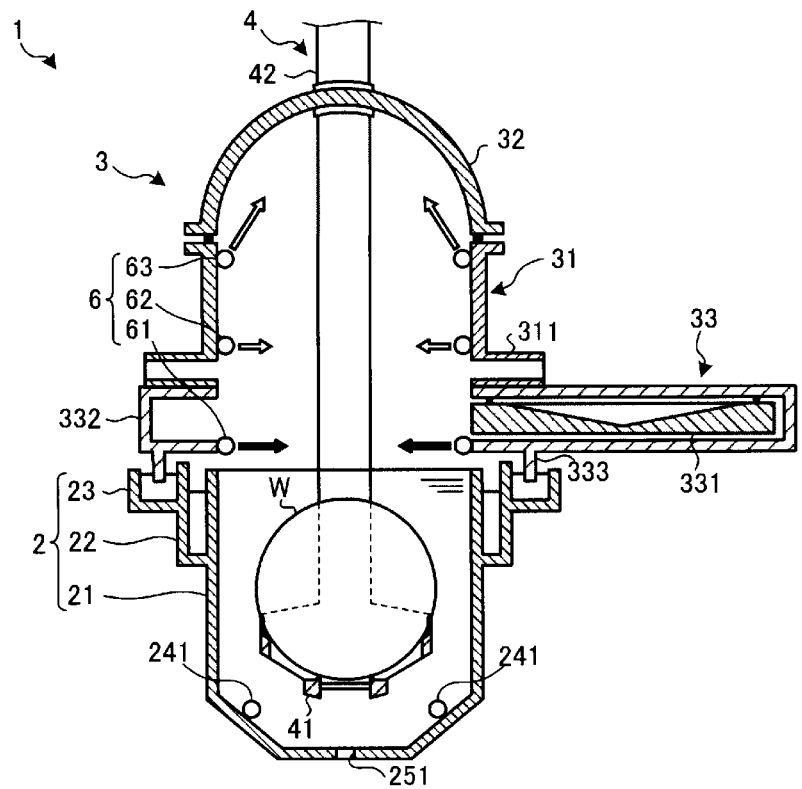
FIG. 6 is a view illustrating an example of an operation of a pre-lifting process.
Figure 7:
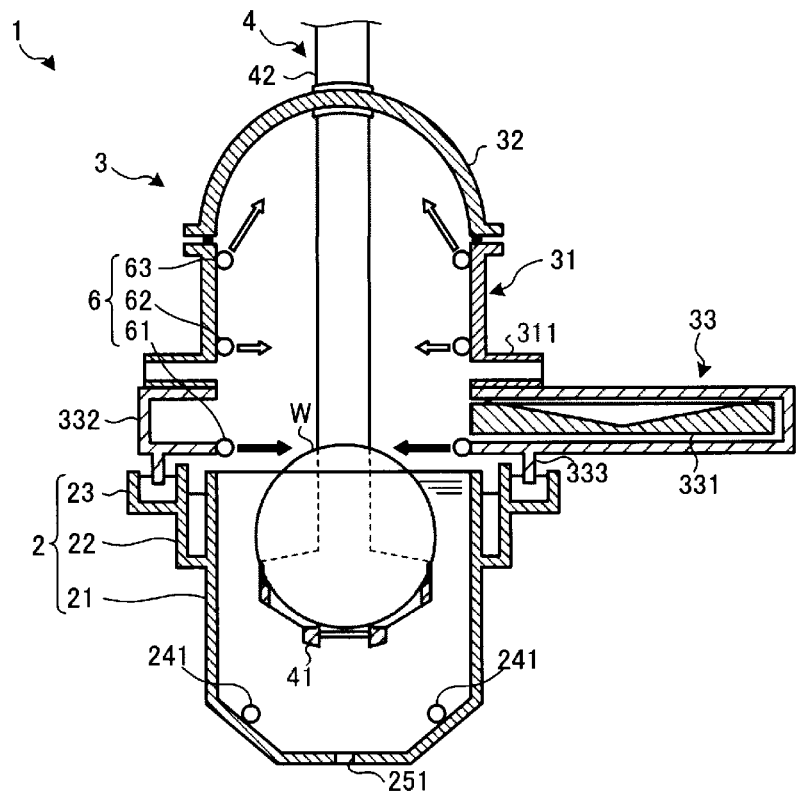
FIG. 7 is a view illustrating an example of an operation of a lifting process.
Figure 8:
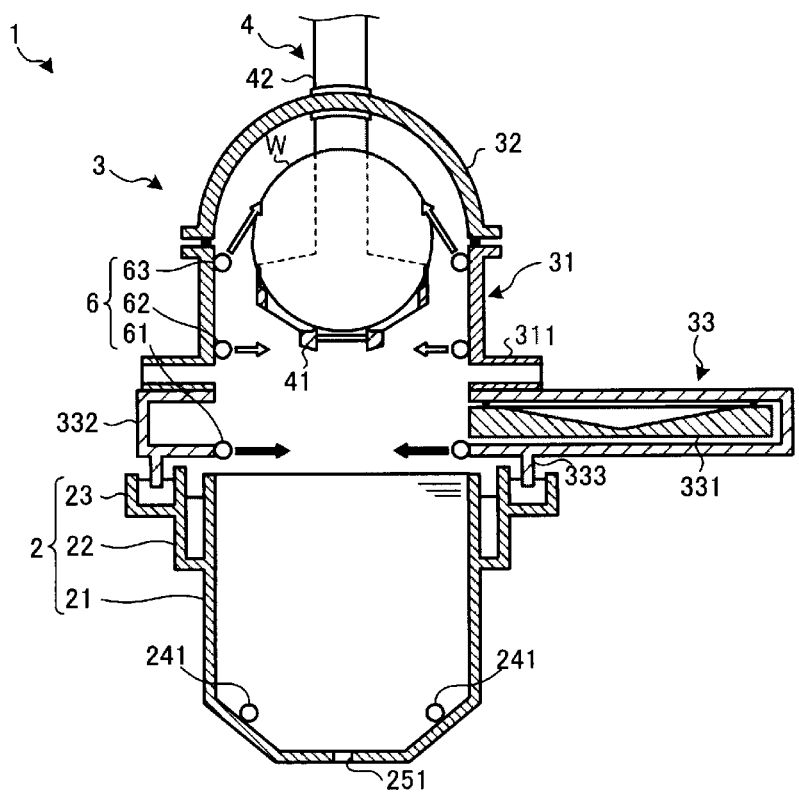
FIG. 8 is a view illustrating an example of the operation of the lifting process.
Figure 13:
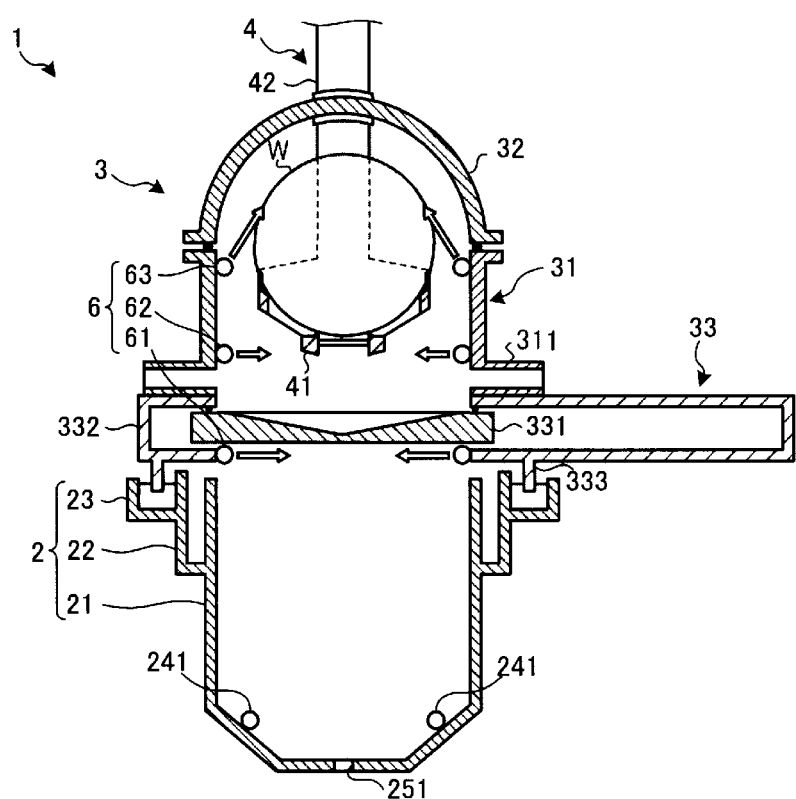
FIG. 13 is a view illustrating an example of an operation of a post-lifting process.
Figure 14:
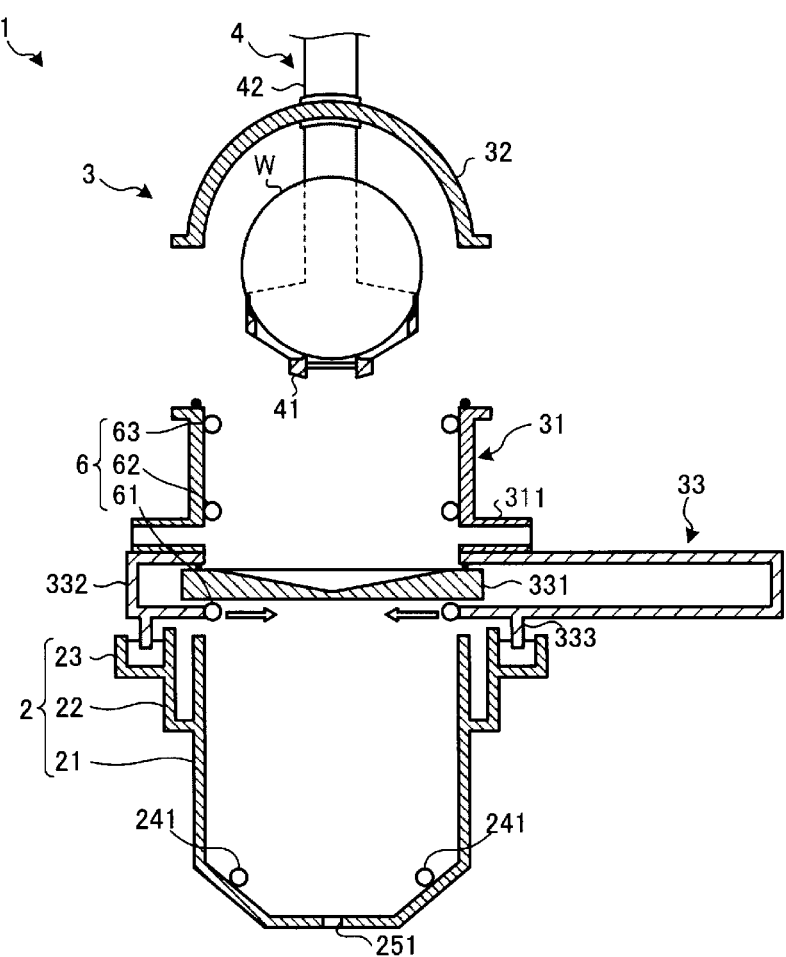
FIG. 14 is a view illustrating an example of an operation of a carry-out process.
Figure 15:
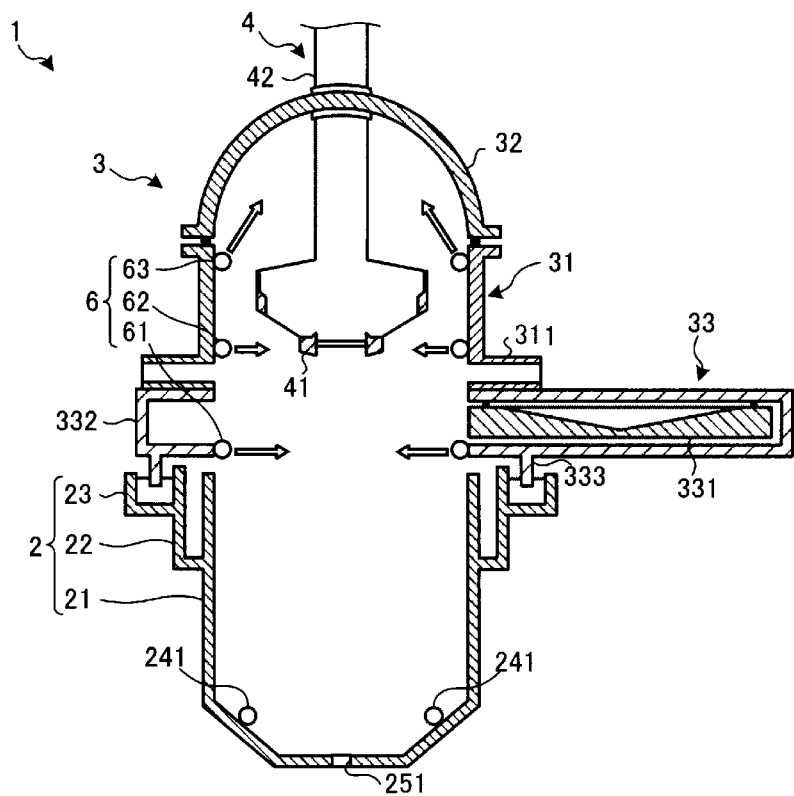
FIG. 15 is a view illustrating an example of an operation of a storing process.
Figure 16:
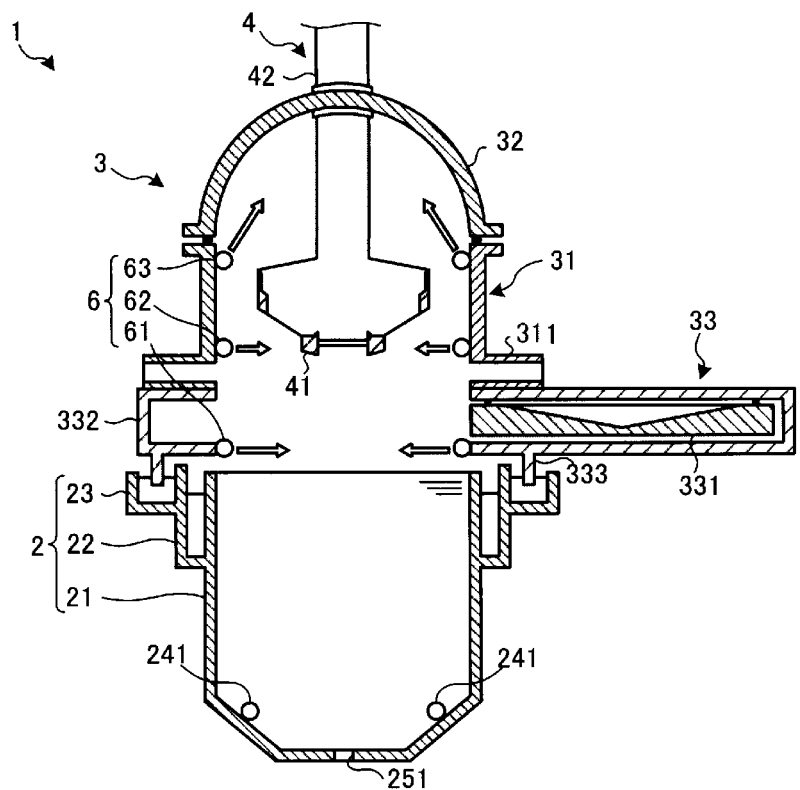
FIG. 16 is a view illustrating an example of the operation of the storing process.

Next, the specific operation of the substrate processing apparatus 1 according to the embodiment will be described with reference to FIGS. 3 to 13. FIG. 3 is a flowchart illustrating an example of a procedure of the processes performed by the substrate processing apparatus 1 according to the embodiment. FIG. 4 is a view illustrating an example of an operation of a carry-in process, FIG. 5 is a view illustrating an example of an operation of a liquid processing, FIG. 6 is a view illustrating an example of an operation of a pre-lifting process, and FIGS. 7 and 8 are views illustrating an example of an operation of a lifting process. FIGS. 9 to 12 are views illustrating an example of a state where the ejection flow rate of the IPA vapor is changed as the plurality of wafers are moved up. FIG. 13 is a view illustrating an example of an operation of a post-lifting process, FIG. 14 is a view illustrating an example of an operation of a carry-out process according to the embodiment, and FIGS. 15 and 16 are views illustrating an example of an operation of a storing process according to the embodiment.

In addition, of the arrows extending from the nozzles 61 to 63 in FIGS. 5 to 16, blank arrows represent that the hot $N_2$ gas is being ejected from the nozzles 61 to 63, and black arrows represent that the IPA vapor is being ejected from the nozzles 61 to 63.

As illustrated in FIG. 3, in the substrate processing apparatus 1, a carry-in process is performed to carry the plurality of wafers W into the storage tank 21 (step S101). Specifically, the controller 71 controls a substrate transfer device (not illustrated) that transfers the plurality of wafers W, to transfer the plurality of wafers W to the holding body 41 of the holder 4 (see FIG. 4). Thereafter, the controller 71 controls, for example, the movement mechanism 5 to move the lid 32 and the shaft 42 down. Accordingly, the top opening of the main body 31 of the drying chamber 3 is closed by the lid 32, such that the drying chamber 3 becomes a sealed state.

Subsequently, in the substrate processing apparatus 1, a liquid processing is performed to process the plurality of wafers W with the processing liquid (step S102). Specifically, the controller 71 controls the movement mechanism 5 to move the shaft 42 down, such that the plurality of wafers W are immersed in the processing liquid stored in the storage tank 21 (see FIG. 5). Accordingly, the plurality of wafers W are processed by the processing liquid. Here, a rinsing process using deionized water is performed on the plurality of wafers W.

During the liquid processing, the controller 71 controls the first supply system 64 and the second supply system 65 to eject the hot $N_2$ gas into the drying chamber 3 from the nozzles 61 to 63. Accordingly, oxygen in the drying chamber 3 may be ejected from the exhaust port 311. In addition, the nozzles 61 to 63 may be made warm prior to a subsequent drying process.

Subsequently, in the substrate processing apparatus 1, the drying process is performed to dry the plurality of wafers W. Specifically, as the drying process, a pre-lifting process (step S103), a lifting process (step S104), and a post-lifting process (step S105) are performed.

First, in the pre-lifting process of step S103, the controller 71 controls the first supply system 64 to switch the gas ejected from the lower nozzle 61 from the hot $N_2$ gas to the IPA vapor (see FIG. 6). Accordingly, the IPA vapor is ejected from the lower nozzle 61, and a liquid film of the IPA is formed on the liquid surface of the processing liquid stored in the storage tank 21.

Subsequently, the lifting process is performed (step S104). In the lifting process, the controller 71 controls the movement mechanism 5 to move the shaft 42 up. Accordingly, the plurality of wafers W start to be exposed from the liquid surface of the processing liquid (see FIG. 7). As described above, the lower nozzle 61 is disposed near the liquid surface of the processing liquid stored in the storage tank 21. Thus, the lower nozzle 61 is able to supply the IPA vapor to the plurality of wafers W from the time immediately after the plurality of wafers W are exposed from the liquid surface of the processing liquid. In addition, since the ejection of the IPA vapor has already been started in the pre-lifting process, the IPA vapor may be more reliably supplied to the plurality of wafers W immediately after the wafers W are exposed from the liquid surface of the processing liquid. When the IPA vapor comes into contact with the surfaces of the plurality of wafers W, the processing liquid attached to the surfaces of the plurality of wafers W is replaced with the IPA.

Here, in the related art, the drying chamber is brought into the state of being filled with the IPA vapor, and the wafers processed with a liquid are lifted to the drying chamber filled with the IPA vapor, such that the processing liquid attached to the wafers is replaced with the IPA. However, with the recent tendency that patterns are miniaturized, and an aspect ratio increases, it is highly likely that a collapse of patterns occurs during the time period until the wafers are completely lifted.

In the meantime, in the substrate processing apparatus 1, the lower nozzle 61 is disposed near the liquid surface of the processing liquid, such that the IPA vapor is immediately supplied from the lower nozzle 61 to the wafers W immediately after the wafers W are exposed from the liquid surface of the processing liquid. Thus, it is possible to suppress the collapse of patterns from occurring during the time period until the plurality of wafers W are completely lifted after the liquid processing is ended.

Further, the IPA vapor is cooled by being in contact with the surfaces of the wafers W. Accordingly, the IPA vapor is condensed on the surfaces of the wafers W, and liquid-type IPA is adsorbed to the surfaces of the wafers W, such that the processing liquid attached to the surfaces of the wafers W is replaced with the IPA. In this way, in order to replace the processing liquid attached to the surfaces of the wafers W with the IPA, it is preferable that the temperature difference between the IPA vapor and the wafers W is large. Meanwhile, since the temperature in the drying chamber 3 is higher than the temperature of the processing liquid, the temperature of the plurality of wafers W increases as the wafers W are lifted from the processing liquid. That is, the temperature difference between the IPA vapor and the wafers W gradually decreases.

Meanwhile, in the substrate processing apparatus 1, since the IPA vapor is immediately supplied from the lower nozzle 61 to the wafers W immediately after the wafers W are exposed from the liquid surface of the processing liquid, the relatively high-temperature IPA vapor may be supplied to the wafers W in a state relatively close to the temperature of the processing liquid. Accordingly, the processing liquid attached to the surfaces of the wafers W may be efficiently replaced with the IPA. Further, since the substrate processing apparatus 1 according to the embodiment includes the cooler 244 that cools the processing liquid supplied to the storage tank 21, the temperature difference between the IPA vapor and the wafers W may be made large, as compared with, for example, a case where the processing liquid having a temperature around the room temperature is used.

Further, in the related art, the IPA vapor is ejected from a nozzle provided in the drying chamber toward the ceiling of the drying chamber, such that the drying chamber is entirely filled with the IPA vapor. In the meantime, in the substrate processing apparatus 1, the IPA vapor is supplied directly to the plurality of wafers W. Accordingly, the efficiency in supplying the IPA vapor to the wafers W may be improved, as compared with the related art. In other words, the consumption amount of the IPA vapor may be reduced.

Further, in the substrate processing apparatus 1, since the liquid film of IPA is formed on the liquid surface of the processing liquid by the pre-lifting process, the IPA existing on the liquid surface of the processing liquid may be attached to the surfaces of the wafers W during the process of lifting the wafers W from the processing liquid in the lifting process. Thus, the amount of the processing liquid remaining on the surfaces of the wafers W may be reduced, so that the efficiency in replacing the processing liquid with the IPA may be improved, as compared with a case where the pre-lifting process is not performed.

The plurality of wafers W are exposed from the liquid surface of the processing liquid, sequentially starting from the tops of the wafers W according to the lifting by the movement mechanism 5. Thus, the IPA vapor ejected from the lower nozzle 61 is supplied to the plurality of wafers W sequentially from the tops of the wafers W. Then, as illustrated in FIG. 8, when the plurality of wafers W are entirely exposed from the liquid surface of the processing liquid, the wafers W become a state where the IPA vapor ejected from the lower nozzle 61 is supplied to the entire portions of the plurality of wafers W, that is, a state where the replacement between the processing liquid and the IPA is completed.

Each wafer W has a circular shape, and is lifted in the vertical posture. Thus, the area of the plate surface of the wafer W exposed per unit time from the liquid surface of the processing liquid increases during the time period when the upper half of the wafer W is exposed from the liquid surface, and decreases thereafter. Thus, in a case where the IPA vapor is ejected from the lower nozzle 61 at a constant ejection flow rate, the IPA vapor may be excessively supplied to the wafer W, for example, when the area of the plate surface of the wafer W exposed per unit time from the liquid surface of the processing liquid decreases.

Thus, in the substrate processing apparatus 1 according to the embodiment, the ejection flow rate of the IPA vapor ejected from the lower nozzle 61 is changed as the plurality of wafers W are moved up.

Figure 9:
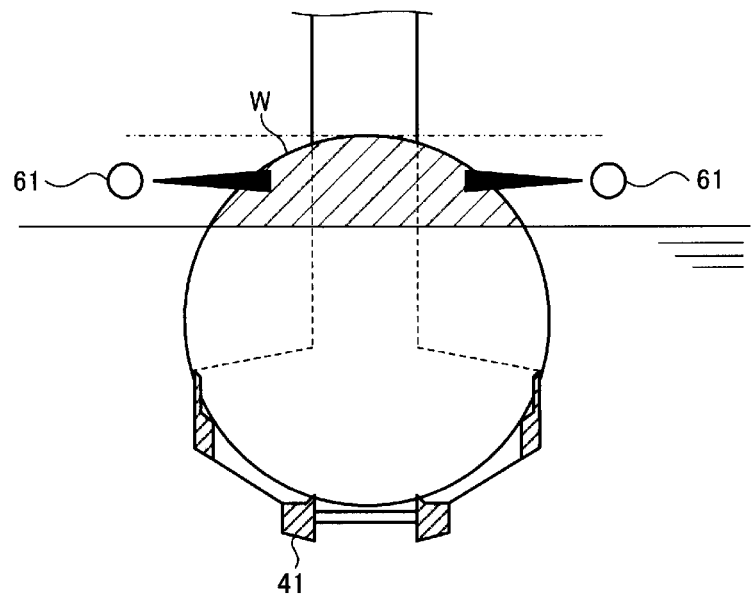
FIG. 9 is a view illustrating an example of a state where an ejection flow rate of an IPA (isopropyl alcohol) vapor is changed as a plurality of wafers are moved up.
Figure 10:
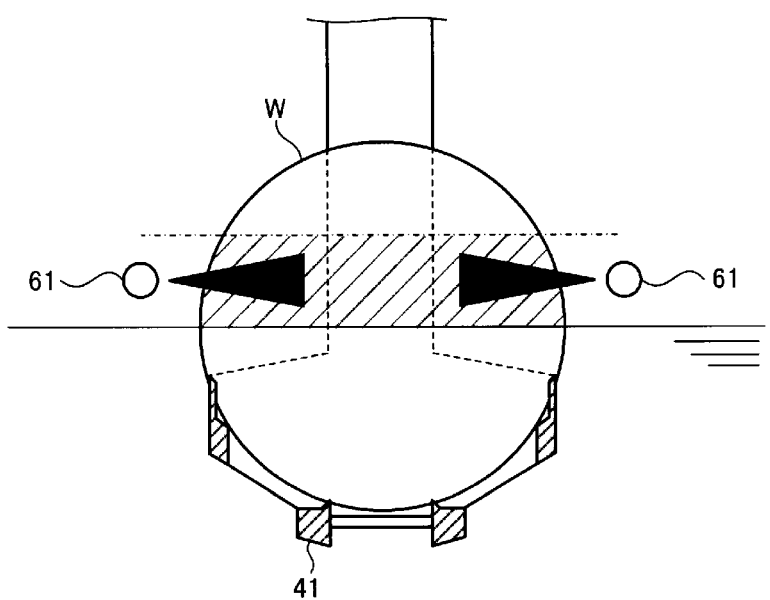
FIG. 10 is a view illustrating an example of the state where the ejection flow rate of the IPA vapor is changed as the plurality of wafers are moved up.

Specifically, as illustrated in FIGS. 9 and 10, the controller 71 controls the first supply system 64 to increase the ejection flow rate of the IPA vapor as the plurality of wafers W are moved up, during the time period from the time when the plurality of wafers W start to be exposed from the liquid surface to the time when the upper halves of the plurality of wafers W are completely exposed.

Figure 11:
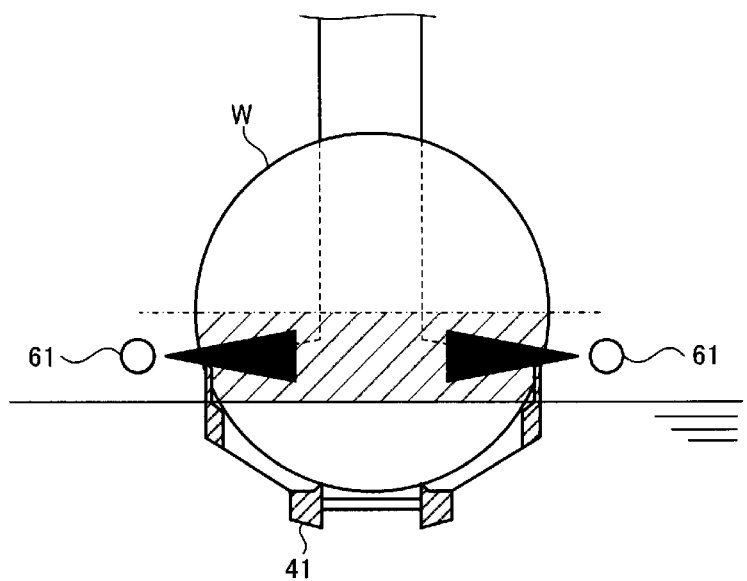
FIG. 11 is a view illustrating an example of the state where the ejection flow rate of the IPA vapor is changed as the plurality of wafers are moved up.
Figure 12:
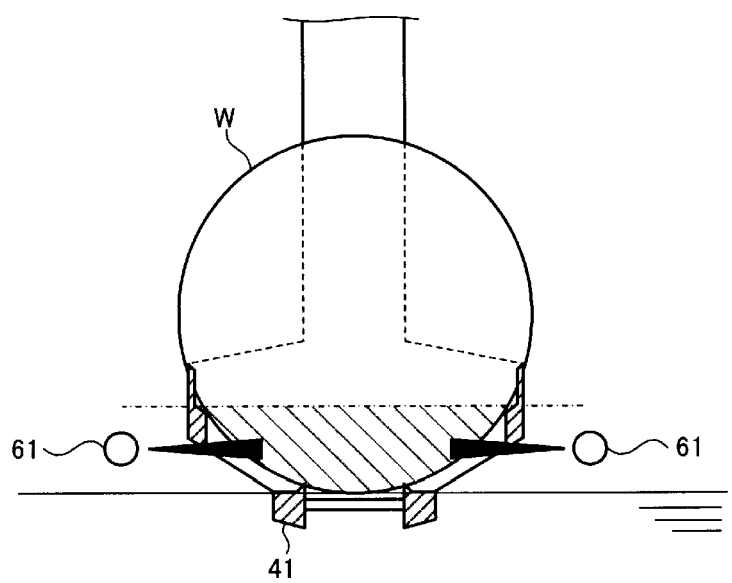
FIG. 12 is a view illustrating an example of the state where the ejection flow rate of the IPA vapor is changed as the plurality of wafers are moved up.

Then, as illustrated in FIGS. 11 and 12, the controller 71 controls the first supply system 64 to reduce the ejection flow rate of the IPA vapor as the plurality of wafers W are moved up, during the time period from the time when the lower halves of the plurality of wafers W start to be exposed from the liquid surface to the time when the entire portions of the plurality of wafers W are exposed.

In this way, the ejection flow rate of the IPA vapor from the lower nozzle 61 is changed as the plurality of wafers W are moved up, so that the supply amount of the IPA vapor per unit area may be made uniform. As a result, the efficiency in replacing the processing liquid with the IPA may be improved.

The controller 71 is able to detect a height position of the plurality of wafers W, based on an output signal from a position detector such as an encoder provided in the holder 4 or the movement mechanism 5. The controller 71 changes the ejection flow rate of the IPA vapor from the lower nozzle 61 according to the detected height position of the plurality of wafers W. In addition, the controller 71 may calculate the height position of the plurality of wafers W, based on the start time when the process of increasing the height position of the plurality of wafers W is started, and a known value of the speed of lifting the plurality of wafers W.

Subsequently, the post-lifting process is performed (step S105). In the post-lifting process, the controller 71 controls the shield 33 to move the shielding door 331, such that the shielding door 331 is disposed at the position for closing the bottom opening of the main body 31 of the drying chamber 3. Accordingly, the drying chamber 3 becomes a state of being sealed by the lid 32 and the shielding door 331 (see FIG. 13). Further, the controller 71 controls the second supply system 65 to eject the hot $N_2$ gas from the upper nozzle 63. Accordingly, the volatilization of the IPA remaining on the surfaces of the plurality of wafers W is promoted, such that the plurality of wafers W are dried.

Further, in the post-lifting process, the controller 71 controls the draining mechanism 25 to open the valve 253, such that the processing liquid is ejected from the storage tank 21. At this time, the controller 71 controls the first supply system 64 to eject the hot $N_2$ gas from the lower nozzle 61.

Subsequently, in the substrate processing apparatus 1, the carry-out process is performed (step S106). In the carry-out process, the controller 71 controls the second supply system 65 to stop the ejection of the hot $N_2$ gas from the upper nozzle 63. Further, the controller 71 controls, for example, the movement mechanism 5 to move the lid 32 and the holder 4 up (see FIG. 14). Then, the controller 71 controls a substrate transfer device (not illustrated) to transfer the plurality of wafers W from the holding body 41 to the substrate transfer device.

Subsequently, the storing process is performed in the substrate processing apparatus 1 (step S107). In the storing process, the controller 71 controls, for example, the movement mechanism 5 to move the lid 32 and the holder 4 down such that the drying chamber 3 is sealed. Further, the controller 71 controls the first supply system 64 and the second supply system 65 to eject the hot $N_2$ gas from the nozzles 61 to 63 (see FIG. 15). Then, the controller 71 controls the liquid ejector 24 to open the valve 245, such that the processing liquid is supplied to the storage tank 21. Accordingly, the processing liquid is stored in the storage tank 21 (see FIG. 16). When the storing process is ended, the controller 71 ends the series of substrate processing.

OTHER EMBODIMENTS

In the embodiment described above, an example where the lower nozzle 61 horizontally ejects the IPA vapor has been described. However, the lower nozzle 61 may eject the IPA vapor obliquely downward. When the IPA vapor is ejected obliquely downward from the lower nozzle 61, the IPA vapor may be supplied relatively early to the plurality of wafers W exposed from the liquid surface of the processing liquid. Further, when the IPA vapor is ejected obliquely downward from the lower nozzle 61, the liquid film of IPA may be efficiently formed on the liquid surface of the processing liquid in the pre-lifting process.

In addition, in the embodiment described above, an example where the hot $N_2$ gas is ejected from the middle nozzle 62 and the upper nozzle 63 during the lifting process has been described. However, the controller 71 may cause the middle nozzle 62 and the upper nozzle 63 to eject the IPA vapor in the lifting process.

For example, when the plurality of wafers W are lifted to the position where the hot $N_2$ gas ejected from the middle nozzle 62 is supplied to the upper ends of the plurality of wafers W, the controller 71 controls the second supply system 65 to switch the hot $N_2$ gas ejected from the middle nozzle 62 to the IPA vapor. At this time, the controller 71 may stop the ejection of the hot $N_2$ gas from the upper nozzle 63, or may cause the upper nozzle 63 to eject the IPA vapor together with the middle nozzle 62.

As described above, by increasing the ejection position of the IPA vapor as the plurality of wafers W are moved up, the IPA vapor may be continuously ejected at all times from the vicinity of the wafers W. As a result, the IPA vapor may be efficiently supplied to the wafers W that are being lifted.

As described above, the substrate processing apparatus (e.g., the substrate processing apparatus 1) according to the embodiment includes a liquid processing tank (e.g., the liquid processing tank 2), a movement mechanism (e.g., the movement mechanism 5), an ejector (e.g., the gas ejector 6), and a controller (e.g., the control device 7). The liquid processing tank stores a processing liquid (e.g., deionized water). The movement mechanism moves a plurality of substrates (e.g., wafers W) immersed in the liquid processing tank to a position above the liquid surface of the processing liquid. The ejector ejects a vapor of an organic solvent (e.g., IPA) toward the portions of the plurality of substrates that are exposed from the liquid surface. The controller changes the ejection flow rate of the vapor of the organic solvent ejected by the ejector as the plurality of substrates are moved up.

As a result, the supply amount of the vapor of the organic solvent per unit area to the plurality of substrates may be made uniform, so that the efficiency in replacing the processing liquid with the organic solvent may be improved.

The controller (e.g., the control device 7) may increase the ejection flow rate of the vapor of the organic solvent ejected by the ejector (e.g., the gas ejector 6) as the plurality of substrates are moved up, during the time period from the time when the plurality of substrates start to be exposed from the liquid surface to the time when the upper halves of the plurality of substrates are completely exposed from the liquid surface, and thereafter, may reduce the ejection flow rate of the vapor ejected by the ejector as the plurality of substrates are moved up. As a result, the supply amount of the organic solvent per unit area to the plurality of substrates may be made uniform.

The ejector may be disposed at a position lower than the height position of the upper ends of the plurality of substrates when the upper halves of the plurality of substrates are completely exposed from the liquid surface. In this manner, the ejector is disposed near the liquid surface of the processing liquid, so that the vapor of the organic solvent may be supplied to the plurality of substrates from the time immediately after the plurality of substrates are exposed from the liquid surface of the processing liquid.

The ejector (e.g., the gas ejector 6) may be disposed on the lateral side of the path in which the plurality of substrates are moved by the movement mechanism (e.g., the movement mechanism 5), so as to eject the vapor horizontally or obliquely downward toward the plurality of substrates. As a result, the vapor of the organic solvent may be supplied relatively early to the plurality of substrates exposed from the liquid surface of the processing liquid.

The ejector (e.g., the gas ejector 6) may include a plurality of nozzles (e.g., the lower nozzle 61, the middle nozzle 62, and the upper nozzle 63) arranged in multiple tiers. Thus, for example, the ejection of the vapor of the organic solvent is started in an order from the nozzle arranged at the lowermost tier (e.g., in the order of the lower nozzle 61 and the middle nozzle 62) as the plurality of substrates are moved up, so that the vapor of the organic solvent may be continuously ejected at all times from the vicinity of the plurality of substrates. As a result, the efficiency in replacing the processing liquid with the organic solvent may be further improved.

The ejector (e.g., the gas ejector 6) may start the ejection of the vapor of the organic solvent before the plurality of substrates are exposed from the liquid surface of the processing liquid. Then, the liquid film of the organic solvent may be formed on the liquid surface of the processing liquid before the plurality of substrates are exposed from the liquid surface of the processing liquid. Thus, the organic solvent present on the liquid surface of the processing liquid may be attached to the surfaces of the substrates in the process of lifting the plurality of substrates from the processing liquid. As a result, the amount of the processing liquid remaining on the surfaces of the substrates may be reduced, so that the efficiency in replacing the processing liquid with the organic solvent may be improved.

The substrate processing apparatus (e.g., the substrate processing apparatus 1) according to the embodiment may include a cooler (e.g., the cooler 244) that cools the processing liquid. Then, the temperature difference between the vapor of the organic solvent and the substrates may be made large, in compared with a case where the processing liquid is not cooled. As a result, the efficiency in replacing the processing liquid with the organic solvent may be improved.

According to the present disclosure, in the technology of bringing a substrate to which a processing liquid is attached into contact with a vapor of an organic solvent thereby drying the substrate, the efficiency in replacing the processing liquid with the organic solvent may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a liquid processing tank configured to store a processing liquid and positioned below a drying chamber;
a mover configured to move a plurality of substrates immersed in the liquid processing tank to a position above a liquid surface of the processing liquid;
an ejector including an upper nozzle and a lower nozzle configured to eject an inert gas, the lower nozzle also configured to eject a vapor of an organic solvent toward portions of the plurality of substrates that are exposed from the liquid surface; and a controller configured to control an overall operation of the substrate processing apparatus, wherein the controller is programmed to eject an inert gas from the upper nozzle and the lower nozzle when the plurality of substrates are immersed in the processing liquid, switch an ejected gas from the lower nozzle from the inert gas to the vapor of the organic solvent, change an ejection flow rate of the vapor ejected by the lower nozzle as the plurality of substrates are moved to the position above the liquid surface of the processing liquid by the mover, and wherein the lower nozzle is disposed at a position lower than a height position of upper ends of the plurality of substrates when the upper halves of the plurality of substrates are completely exposed from the liquid surface.

2. The substrate processing apparatus according to claim 1, wherein the controller increases the ejection flow rate of the vapor ejected by the lower nozzle as the plurality of substrates are moved to the position above the liquid surface of the processing liquid by the mover during a time period from a time when the plurality of substrates start to be exposed from the liquid surface to a time when upper halves of the plurality of substrates are completely exposed from the liquid surface, and thereafter, reduces the ejection flow rate of the vapor ejected by the lower nozzle as the plurality of substrates are moved to the position above the liquid surface of the processing liquid by the mover.

3. The substrate processing apparatus according to claim 2, wherein the lower nozzle is disposed on a lateral side of a path in which the plurality of substrates are moved by the mover, and ejects the vapor horizontally or obliquely downward toward the plurality of substrates.

4. The substrate processing apparatus according to claim 2, wherein the upper nozzle and the lower nozzle include a plurality of nozzles arranged in multiple tiers.

5. The substrate processing apparatus according to claim 2, wherein the lower nozzle starts the ejection of the vapor before the plurality of substrates are exposed from the liquid surface of the processing liquid.

6. The substrate processing apparatus according to claim 1, wherein the lower nozzle is disposed on a lateral side of a path in which the plurality of substrates are moved by the mover, and ejects the vapor horizontally or obliquely downward toward the plurality of substrates.

7. The substrate processing apparatus according to claim 6, wherein the upper nozzle and lower nozzle include a plurality of nozzles arranged in multiple tiers.

8. The substrate processing apparatus according to claim 6, wherein the lower nozzle starts the ejection of the vapor before the plurality of substrates are exposed from the liquid surface of the processing liquid.

9. The substrate processing apparatus according to claim 6, further comprising;

a cooler configured to cool the processing liquid.

10. The substrate processing apparatus according to claim 1, wherein the upper nozzle and the lower nozzle include a plurality of nozzles arranged in multiple tiers.

11. The substrate processing apparatus according to claim 10, wherein the lower nozzle starts the ejection of the vapor before the plurality of substrates are exposed from the liquid surface of the processing liquid.

12. The substrate processing apparatus according to claim 10, further comprising;

a cooler configured to cool the processing liquid.

13. The substrate processing apparatus according to claim 1, wherein the lower nozzle starts the ejection of the vapor before the plurality of substrates are exposed from the liquid surface of the processing liquid.

14. The substrate processing apparatus according to claim 1, further comprising;

a cooler configured to cool the processing liquid.

15. A substrate processing method comprising:

immersing a plurality of substrates in a processing liquid stored in a liquid processing tank;

ejecting an inert gas from an upper nozzle and a lower nozzle when the plurality of substrates are immersed in the processing liquid;

switching an ejected gas from the lower nozzle from the inert gas to a vapor of the organic solvent;

moving the plurality of substrates to a position above a liquid surface of the processing liquid after the switching; and ejecting the vapor of an organic solvent toward portions of the plurality of substrates that are exposed from the liquid surface from a lower nozzle, during the moving the plurality of substrates, wherein in the ejecting the vapor of the organic solvent from the lower nozzle, an ejection flow rate of the vapor is changed as the plurality of substrates are moved to the position above the liquid surface of the processing liquid, and wherein the lower nozzle is disposed at a position lower than a height position of upper ends of the plurality of substrates when the upper halves of the plurality of substrates are completely exposed from the liquid surface.

16. A non-transitory computer-readable storage medium having stored therein a program that causes a computer to perform the substrate processing method according to claim 15.

* * * * *